United States Patent
Sanghera et al.

(10) Patent No.: US 9,558,920 B2
(45) Date of Patent: Jan. 31, 2017

(54) SYSTEM AND METHOD FOR DIRECT FIBER-END SURFACE STRUCTURING

(71) Applicants: Jasbinder S. Sanghera, Ashburn, VA (US); Catalin M. Florea, Jenkintown, PA (US); Ishwar D. Aggarwal, Charlotte, NC (US); Leslie Brandon Shaw, Woodbridge, VA (US); Lynda E. Busse, Alexandria, VA (US); Frederic H. Kung, Alexandria, VA (US)

(72) Inventors: Jasbinder S. Sanghera, Ashburn, VA (US); Catalin M. Florea, Jenkintown, PA (US); Ishwar D. Aggarwal, Charlotte, NC (US); Leslie Brandon Shaw, Woodbridge, VA (US); Lynda E. Busse, Alexandria, VA (US); Frederic H. Kung, Alexandria, VA (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 148 days.

(21) Appl. No.: 14/498,001

(22) Filed: Sep. 26, 2014

(65) Prior Publication Data

US 2015/0090690 A1   Apr. 2, 2015

Related U.S. Application Data

(60) Provisional application No. 61/883,424, filed on Sep. 27, 2013.

(51) Int. Cl.
*G02B 6/25*   (2006.01)
*G02B 6/42*   (2006.01)
*H01J 37/32*  (2006.01)
*G02B 6/26*   (2006.01)

(52) U.S. Cl.
CPC ......... *H01J 37/32715* (2013.01); *G02B 6/25* (2013.01); *G02B 6/262* (2013.01); *H01J 37/32091* (2013.01); *H01J 37/32568* (2013.01); *G02B 6/4296* (2013.01); *H01J 2237/334* (2013.01)

(58) Field of Classification Search
CPC ......... G02B 6/25; G02B 6/4296; G02B 6/262; H01J 37/32715; H01J 37/32009; H01J 37/32724; H01J 37/32091; H01J 37/32568; H01J 2237/334
USPC .......... 385/14, 24, 147; 216/24; 156/345.51, 156/345.27, 345.24, 345.47
See application file for complete search history.

(56) References Cited

U.S. PATENT DOCUMENTS

| | | | | |
|---|---|---|---|---|
| 7,198,550 | B2* | 4/2007 | Ohishi | B24B 19/226 451/41 |
| 8,746,991 | B2* | 6/2014 | Takeda | B23P 6/00 385/95 |
| 8,966,988 | B2* | 3/2015 | Yu | G01L 9/0079 73/705 |

(Continued)

*Primary Examiner* — Akm Enayet Ullah
(74) *Attorney, Agent, or Firm* — US Naval Research Laboratory; Rebecca L. Forman (57) ABSTRACT

A fiber-end surface structuring chamber or system having a main body with multiple ports including a fiber-holder port, a process port that is either a stamp/shim holder port or a plasma etching enabler port, an evacuation port, a gas delivery port, and one or more observation ports, where the fiber-end surface structuring system forms structures directly into the end of the fiber to enhance transmission of light over a wide range of wavelengths and increase the laser damage threshold.

14 Claims, 5 Drawing Sheets

(56) References Cited

U.S. PATENT DOCUMENTS 9,085,040 B2 * 7/2015 Li .................... G02B 6/2552

* cited by examiner

SYSTEM AND METHOD FOR DIRECT FIBER-END SURFACE STRUCTURING

PRIORITY CLAIM

The present application is a non-provisional application claiming the benefit of U.S. Provisional Application No. 61/883,424, filed on Sep. 27, 2013 by Jasbinder S. Sanghera et al., entitled "System and Method for Direct Fiber-End Surface Structuring," the entire contents of which is incorporated herein by reference.

BACKGROUND OF THE INVENTION

Field of the Invention

The present invention relates to the field of optical fibers. In particular the present invention relates to a method of micro- and nano-structuring fiber ends to enhance transmission of light over a wide range of wavelengths and increase laser damage threshold.

Description of the Prior Art

Typical optical fibers that transmit light in the 0.4 to 1.6 micron range are fabricated from silica glass. Silica glasses are low-index materials having a refractive index of about 1.4 to about 1.5, which is near the 1.0 refractive index of air. Consequently, light passes through the glass-air interface without significant transmission loss, frequently referred to as Fresnel loss. Typically silica optical fibers have a transmission loss in the near infrared of about 4% loss per interface.

For the mid infrared regions and beyond (e.g. beyond 1.6 µm), optical fibers are typically composed of high index materials, such as chalcogenide glasses. Chalcogenide glasses have high refractive indices of about 2.4 to about 2.8; the light consequently experiences high losses of about 17% to 22% loss per interface when it enters and exits the fiber to and from air, respectively.

A number of different techniques have been developed to reduce transmission loss at optical fiber ends. For example, the change in refractive index at the ends of optical fibers can be reduced by applying an anti-reflective coating on the fiber tip. These coatings take advantage of the interference phenomenon which occurs in thin films and therefore can be designed to enhance the light transmission within a defined wavelength band where constructive interference takes place so as to reduce the reflection on the fiber end. While these coatings are fairly robust in the case of silica-based glasses, they have limitations for infrared materials. In the case of chalcogenide glasses, which cannot be subjected to very high temperatures, the coatings have poor adhesion to the chalcogenide glass and are sensitive to humidity. Additionally, these coatings damage easily under intense laser radiation. Consequently, there is a need for reducing surface reflection losses using a more robust approach and for enabling higher laser power transmission through increased laser damage threshold.

Transmission losses can also be reduced by incorporating a plurality of sub-wavelength surface (SWS) relief structures on the fiber end so as to induce the refractive index to gradually vary from the refractive index value of surrounding medium (air) to the refractive index value of the window material. These SWS relief structures are generally a collection of objects, such as graded cones, pillars or, similarly, depressions that generate strong diffraction or interference effects due to certain periodic or quasi-random distribution of said objects. The distances between the objects and the dimensions of the objects themselves are typically smaller than the wavelength of light with which they are designed to interact.

The SWS approach has been successfully used on a variety of bulk substrates from glasses to ceramics to optical crystals and polymers. Photolitography followed by plasma etching (for periodic patterns) or simply plasma etching (for quasi-random patterns) have been the methods of choice for SWS structuring of bulk substrates.

Little has been done, to date, to create SWS directly into the ends of optical fibers and without the help of extrinsic materials (such as depositing a coating of nanoparticles or depositing a layer of a soft material which is further nano-structured as needed). Neuberger et al. (U.S. Pat. No. 6,208,781) teaches how a silica fiber end can be structured using a patterned molybdenum stamp. Sanghera et al. (Opt. Expr. 18, 26760) teaches how a chalcogenide fiber can be structured using a patterned nickel or silicon stamp. However, both consider only periodic patterns for the stamp and, hence, are demonstrating the case of fiber end structuring with a periodic pattern. Additionally, no actual attempt has been done, to date, for developing and disclosing a system capable of industrial-like processes for fiber end structuring.

BRIEF SUMMARY OF THE INVENTION

The aforementioned problems are overcome in the present invention which provides a fiber-end surface structuring chamber or system having a main body with multiple ports including a fiber-holder port, a process port that is either a stamp/shim holder port or a plasma etching enabler port, an evacuation port, a gas delivery port, and one or more observation ports, where the fiber-end surface structuring system forms structures directly into the end of the fiber to enhance transmission of light over a wide range of wavelengths and increase the laser damage threshold.

It is an object of the present invention to provide a system that can provide industrial-like capability of structuring an optical fiber end with a periodic or quasi-random structure with the goal of reducing the Fresnel loss for light propagating through said fiber.

A further object of the invention is to increase laser power handling capability, meaning an increase in the laser damage threshold, of optical fibers that have enhanced transmission due to the structuring of the fiber ends.

These and other features and advantages of the invention, as well as the invention itself, will become better understood by reference to the following detailed description, appended claims, and accompanying drawings.

DETAILED DESCRIPTION OF THE INVENTION

Although certain embodiments of the invention are specifically described herein, one of ordinary skill in the art will readily recognize that the same principles are equally applicable to, and can be employed in other systems and methods. Additionally, the terminology used herein is for the purpose of description and not of limitation. Furthermore, although certain methods are described with reference to steps that are presented herein in a certain order, in many instances, these steps may be performed in any order as may be appreciated by one skilled in the art; the novel method is therefore not limited to the particular arrangement of steps disclosed herein.

For purposes of the present invention, "microstructuring," "nanostructuring," or simply "structuring" will be used interchangeably. Furthermore, "microstructures" as used herein refers to a plurality of periodic or randomly arranged micron-sized or nano-sized structures, such as protrusions, depressions, or combinations thereof; the term "microstructured surface" refers to a surface on which the microstructures are formed. Exemplary microstructures may be a collection of protrusions or depressions having identical or varying geometric configurations and dimensions, wherein the selected geometry of, dimensions of, and spacing between the structures are designed to facilitate, and preferably optimize, the transmission of light at the terminal end of an optical fiber. When formed directly on an end of an optical fiber, the microstructures incrementally change the refractive index at the terminal end of an optical fiber, gradually drawing it closer to the refractive index of the environmental medium surrounding the terminal end of the optical fiber.

For one embodiment of the present invention, the fibers envisioned to have their ends micro- or nano-structured with this system are made of "chalcogenide glass," which refers to a vitreous material composed of one or more chalcogen elements, i.e. Group VI elements of the periodic table. Exemplary chalcogen elements may include sulfur, selenium, tellurium, or their mixtures. The addition of other elements such as germanium, arsenic, antimony or combinations thereof, facilitates glass formation. One or more dopants, such as gallium, rare earth elements, halogen elements, transition metals, or combinations thereof may be added to the chalcogenide glass to enhance the optical properties of the fiber. Exemplary rare earth elements dopants may include optically active elements, such as terbium, praseodymium, neodymium, erbium, cerium, dysprosium, holmium, thulium, ytterbium, or combinations thereof, or non- optically active rare earth elements such as lanthanum, gadolinium, or combinations thereof. Additionally, the chalcogenide glass may optionally further include one or more glass stabilizers, such as one or more halides, such as chlorine, bromine, fluorine, iodine, or combinations thereof. In another embodiment, the chalcogen elements may be mixed with one or more Group IV elements, Group V elements, or combinations thereof to form conventional compound glasses.

For another embodiment of the present invention, the fibers envisioned to have their ends micro- or nano-structured with this system are made of "halide glass," which refers to a vitreous material comprising one or more halogen elements, i.e. Group VII elements of the periodic table. Exemplary halogen elements may include fluorine, chlorine, bromine, iodine, or combinations thereof. Preferably, the halide glass is a fluoride glass, such as $ZrF_4$, $BaF_2$, $LaF_3$, $AlF_3$ NaF (ZBLAN) $ZrF_4$, $BaF_2$, $LaF_3$, $AlF_3$ (ZBLA), $ZrF_4$, $BaF_2$, $LaF_3$ (ZBL), $BeF_2$, and others. One or more dopants, such as gallium, indium, alkali elements, alkaline earth elements, rare earth elements, halogen elements, transition metals, or combinations thereof may be added to the halide glass to enhance the optical properties of the fiber. Exemplary rare earth element dopants may include optically active elements, such as terbium, praseodymium, neodymium, erbium, cerium, dysprosium, holmium, thulium, ytterbium, or combinations thereof, or non-optically active elements such as lanthanum, gadolinium, or combinations thereof.

For yet another embodiment of the present invention, the fibers envisioned to have their ends micro- or nano-structured with this system are made of silica glass. Structuring of silicate fibers, aluminate fibers, phosphate fibers, germanate fibers, tellurite fibers, bismuthate fibers, and antimonate fibers is also made possible by the system disclosed herein. In addition, there are polymer/plastic fiber systems, single-crystal fibers, polycrystalline fibers, and photonic crystal fibers wherein the cladding comprises a periodic or non-periodic array of capillaries or another phase that reduces the effective index.

These fiber systems, including the silica, chalcogenide, and halide glass fiber systems are known to transmit in regions of the 0.2 to 18 μm wavelength range. The specific regions of transmission in the infrared are related to composition and fiber length.

The present invention is directed to a system centered on a fiber-end surface structuring (FE-SS) chamber that is provided with at least two active ports, each port satisfying certain functionality. The ports are provided with specific accessories as required to enable the desired functionality. For simplicity, the port labeling from here on will be the same as the labeling of the specific accessory associated with said port.

Figure 1:
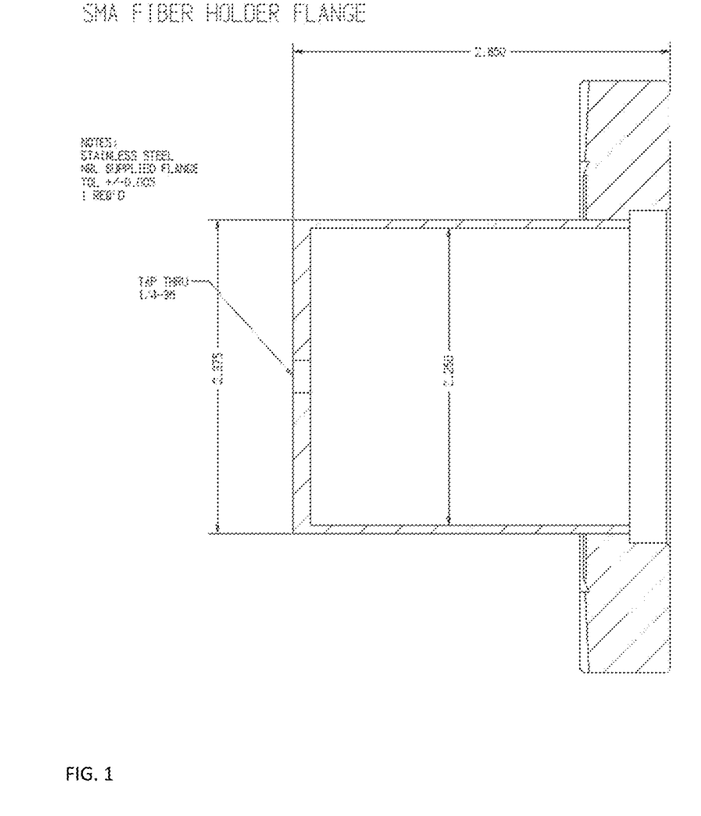
FIG. 1 shows an exemplary schematic drawing for the SMA termination.

In a preferred embodiment, the FE-SS chamber is provided with six ports and it is used as a stamping chamber. The following functionality is given to each of the six ports: The P1-F port provides means to attach an optical fiber. As illustrated in FIG. 1, fiber attachment is achieved using a modified vacuum flange. A cylindrical body is welded or otherwise attached to the flange and it is provided with a fiber connector holder on one of the ends. Different bodies are provided for different connectors (FC connectors or SMA connectors, for example). Alternatively, the same body can be fitted with a removable end plate such that appropriate plates can be mounted to match the specific fiber connector used. The connector holders are designed and built such that an FC or SMA connector will extend past the end of the holder's surface by a certain amount, typically 2 to 4 mm such that the connector end can be easily monitored with a long-working distance objective.

While it is preferred for the fiber to have its end stick out by a certain amount, preferably from 1 and 2000 microns and more preferably from 50 to 500 microns, stamps can be designed such that the patterning is present over a raised region on the stamp, said region preferably circular with a diameter smaller than the ferrule opening. With proper alignment, the stamping process will therefore be initiated only in the area where the glass fiber is mounted within the ferrule.

The other end of the P1-F accessory is open to provide easy access to the fiber connector holder. The connector holder can also have integrated a long-wave detector which can be used to determine the shim temperature at any time during the stamping process. Wiring to the detector can be fitted through the open end as well.

The P2-S/P port (process port) provides, in this embodiment, means to mount and heat a stamp that is patterned with a periodic or a quasi-random pattern. The P2-S/P port is axially opposite to the P1-F port such that, by design, the stamp and the fiber are facing each other with the axis of the fiber perpendicular to the surface of the stamp.

In an exemplary embodiment, the P2-S/P is configured as a shim holder, with and without vacuum bellows. The P2-S/P accessory is fitted with a modified vacuum flange that contains a cylindrical body. The end of the cylinder inside the stamping chamber contains the mounted shim on top of either a miniaturized electrical heater or on top of a custom fiber connector holder or an optics holder.

Figure 2:
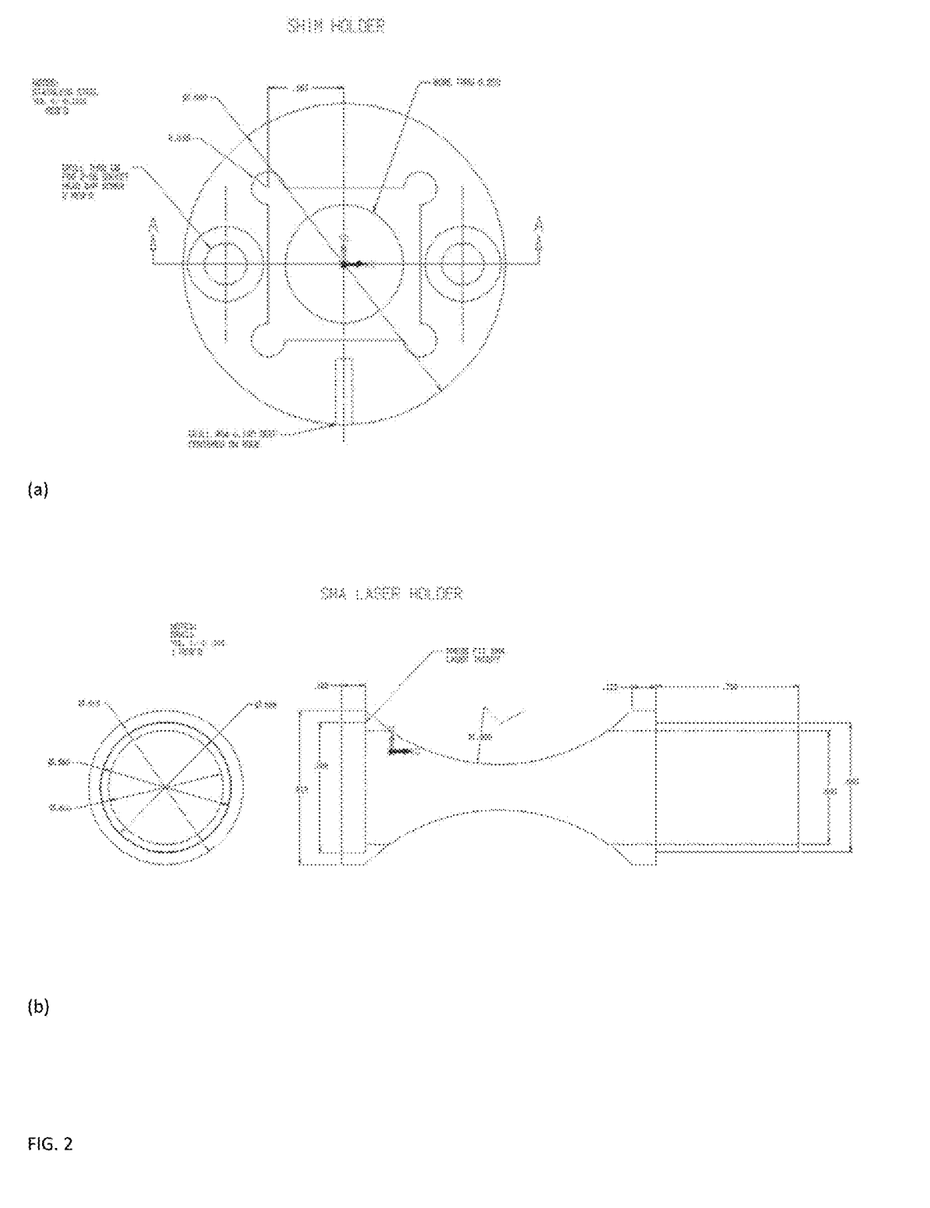
FIG. 2 is a set of exemplary drawings of (a) a shim holder and (b) a laser delivery fiber holder.

An exemplary shim mount holder and an exemplary laser delivery fiber holder are detailed in FIG. 2. The front plate can be removed and replaced with a plate of a different design to accommodate different shape and size shims. Typical shim shape and size is 10 mm×10 mm square with a thickness of 300 to 500 microns. The shim mount is designed in this case to allow laser heating of the shim. The shim is to be glued to the mount or held in place using a low vacuum provided through a channel drilled in the mount.

The other end of the P2-S/P accessory is open to provide room either for the electric heater wiring or for a laser-delivery optical fiber. The advantages of using a laser to heat the stamp are obvious to those skilled in laboratory work. Laser heating is especially efficient in case silicon shims are used for stamping. In the case of silicon, laser diodes emitting in the 770-810 nm range or at similar wavelengths can be used. In the case of chalcogenide glass fibers (typical stamping temperatures needed are around 200° C.), 10 to 15 W of power is sufficient to heat up the shim over a considerable area compared to the area of the fiber to be stamped.

The delivery fiber can be mounted either directly behind the shim or at the opposite end of the tube, far from the shim, case in which a lens system (mounted inside the cylinder) can be used to relay the laser beam to the back of the shim. Back reflection from the stamp can counter-propagate through the delivery fiber into the laser diode used for laser heating. An optical isolator can be used or the delivery fiber can be provided with an angle on the output facet.

Furthermore, the P2-S/P accessory is mounted on an X-Y-Z stage by means of custom fixture and vacuum-capable bellows such that the shim can be moved with respect to the fiber without breaking vacuum. The X and Y directions are perpendicular to the axis of the fiber to be stamped, while the Z direction is along its axis. The X and Y movements allow for exact positioning of the fiber end with respect to the shim surface profile. Particular stamping regions can therefore be addressed, as in the case where only the core and not the cladding are intended to be patterned or in the case where the fiber end does not stick out of the ferrule body. Additionally, tip-tilt capability can easily be implemented to adjust the angle between the fiber end surface and the shim surface.

The X-Y-Z movement, the tip-tilt capability, or both can be installed on the P1-F accessory such that the fiber to be stamped is moved with respect to the shim rather than the shim with respect to the fiber.

The P3-E port provides evacuation means such that the desired level of vacuum is achieved inside. A vacuum gauge can further be attached to the P3-E port. The need for vacuum is dictated by the type of shim features which are to be replicated into the fiber end. If the shim has holes or depressions, vacuum operation is preferred as air trapped in the holes will prevent a faithful replication of the stamp pattern.

The P4-G port provides means to add one or multiple gases to the stamping chamber. The need for process gas is dictated by the specifics of the stamping process; for example, dry nitrogen or dry argon gases can be used prior to stamping to avoid oxidation during heating but without the need to create vacuum.

The P5-W and P6-W are ports provided with windows that allow for visual and laser monitoring of the fiber and of the stamp surface prior, during and after the stamping process. The two ports are preferably placed at 90 degrees from each other. Long-working distance objectives and cameras can be used for visual monitoring while an external laser can be used to probe the shim surface in order to evaluate the shim temperature. In the particular case of silicon shims, a stabilized 633 nm He-Ne laser or a stabilized 594 nm diode laser can be used for surface temperature measurement.

Figure 3:
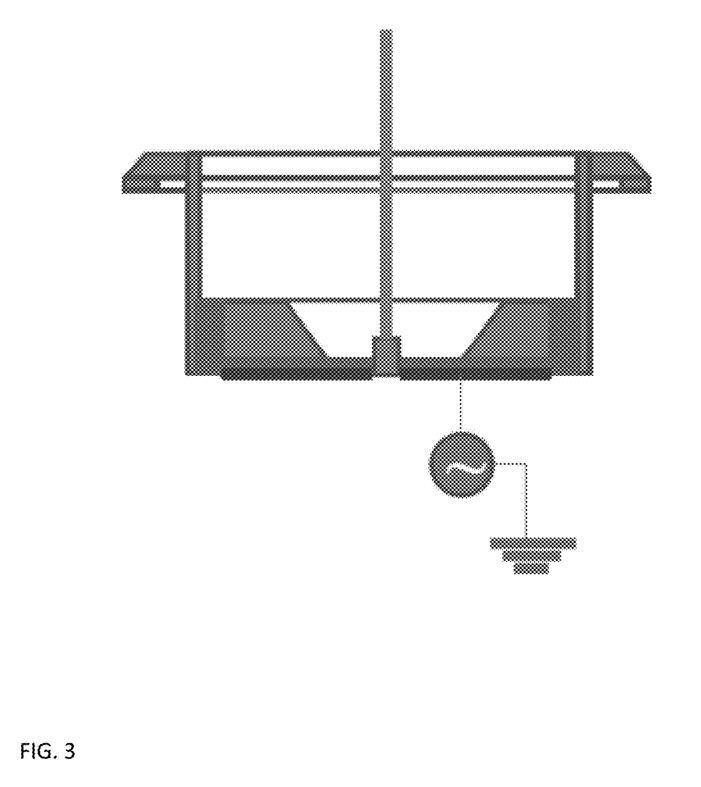
FIG. 3 is a schematic of the fiber-holder port accessory (P1-F) for the plasma etching configuration.

In another embodiment only three ports are used, P1-F, P2-S/P and P3-E, and the FE-SS chamber is used as plasma etching chamber. The P1-F accessory, like above, provides means to attach an optical fiber. The difference is that the connector holder is made such that an FC or SMA connector will have its top surface (where the fiber end is exposed) stop flush with the surface of the connector holder as illustrated in FIG. 3. Alternatively, the P1-F accessory is machined such that an FC or SMA connector will have its top surface (where the fiber end is exposed) stop just under the holder's end surface, separated by said surface by less than 250 microns. The connector holder in this case has a circular opening of a diameter smaller than the ferrule diameter but slightly larger than the diameter of the optical fiber. As an example, for a 125 micron fiber mounted in a 2.5 mm ferrule, the preferred opening in the connector holder is around 250 microns. This will enable enhanced plasma activity at the surface of the fiber end. In both cases, the connector holder is metallic, it is electrically isolated from the body of the flange and it will act as the bottom electrode.

A high-frequency power supply is to be connected to the fiber connector holder where it will output high-frequency power from 50 W to 1500 W in the 27 MHz to 100 MHz frequency range. Those skilled in the plasma etching art will recognize that said fiber holder connector will act as a susceptor and an adapter might also be needed to be integrated in the fiber connector holder to provide impedance matching between the load and the power supply.

Figure 4:
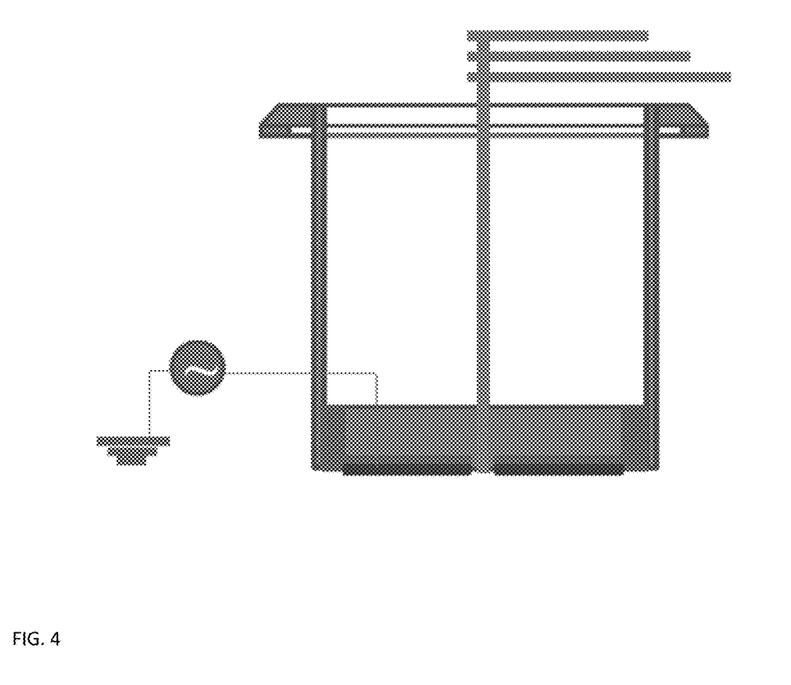
FIG. 4 is a schematic of the process port accessory (P2-S/P) configured as a process gas delivery and plasma electrode.

The P2-S/P process port in this embodiment is configured to provide the process gases required for plasma formation. This is achieved through a custom-designed plate attached to the vacuum flange on the port as illustrated in FIG. 4. The P2-S/P accessory is axially opposite to the P1-F accessory such that, by design, the plate with the process gas apertures and the fiber are facing each other. The axis of the fiber is therefore perpendicular to the surface of the gas delivery plate and preferably perpendicular to the ground. Those skilled in the art of reactive ion etching will recognize that the chamber is intended to operate as a capacitive-coupled parallel-plate plasma etching system. A variable DC power supply capable of providing 100 V to 2000 V can be further attached to the P2-S/P accessory to provide a DC bias to accelerate the plasma ions into the fiber connector holder electrode. Proper cooling of the P1-F accessory might also be required.

The process gases are to be supplied to the chamber with predetermined flow rates such that the pressure in the chamber can reach 5 mTorr to 500 mTorr. Particular combinations of $C_4F_8$, $CHF_3$, $CF_4$, $CH_4$, $CBrF_3$, $SF_6$, $O_2$, and Ar can be identified in order to create a plasma that will create a random surface in the fiber-end surface through ionic bombardment, followed by deposition and re-deposition of matter at a microscopic level.

The choice of gases is dictated by the fiber material. In particular, fused silica fiber can be etched with a combination of $C_4F_8$ and $SF_6$ gases.

The P3-E port provides evacuation means such that the desired level of vacuum is achieved inside. A vacuum gauge can further be attached to the P3-E port. The need for vacuum is dictated by the plasma etching process.

EXAMPLE

The stamping chamber embodiment of the FE-SS chamber is illustrated by the following example. A chalcogenide fiber of 100 micron core diameter and 170 micron clad diameter was mounted into the P1-F accessory. Prior to mounting, the optical fiber was cleaved and mounted in a standard fiber holder, FC or SMA type, for example. The terminal fiber-end sticks out of the body of the connector ferrule by about 200 microns. This quantity can be made much smaller, down to few microns, as allowed by the alignment, visual observation and other process requirements.

A 10 mm×10 mm silicon shim patterned with a periodic microstructure of 750 nm period with individual pillars of 750 nm height is mounted into the P2-S/P accessory. A high-temperature epoxy was used to attach the silicon shim to the stainless steel plate in the P2-S/P, but one can envision a vacuum chuck-type of mounting as well. Clamps or other mechanical devices can also be used to mount the shim but they should be of low-profile to allow contact between the stamp and the fiber end, and they should not block the view for the process cameras that have access to the chamber through the P5-W and P6-W ports.

A laser-delivery fiber cable is connected to the P2-S/P using a custom-designed mount integrated to the back of the shim holder. The delivery fiber has a 200 micron core, 250 micron clad diameter and the delivery end can be polished at 8 degrees from the fiber axis although that might not be necessary if the back of the shim is not highly reflective (the back of the silicon shim can be roughened up such as to minimize back reflections). An NA of 0.22 for the laser-delivery fiber output determines the extent of the laser spot onto the back of the silicon shim based on the separation between the laser delivery fiber end and the back of the silicon shim.

Figure 5:
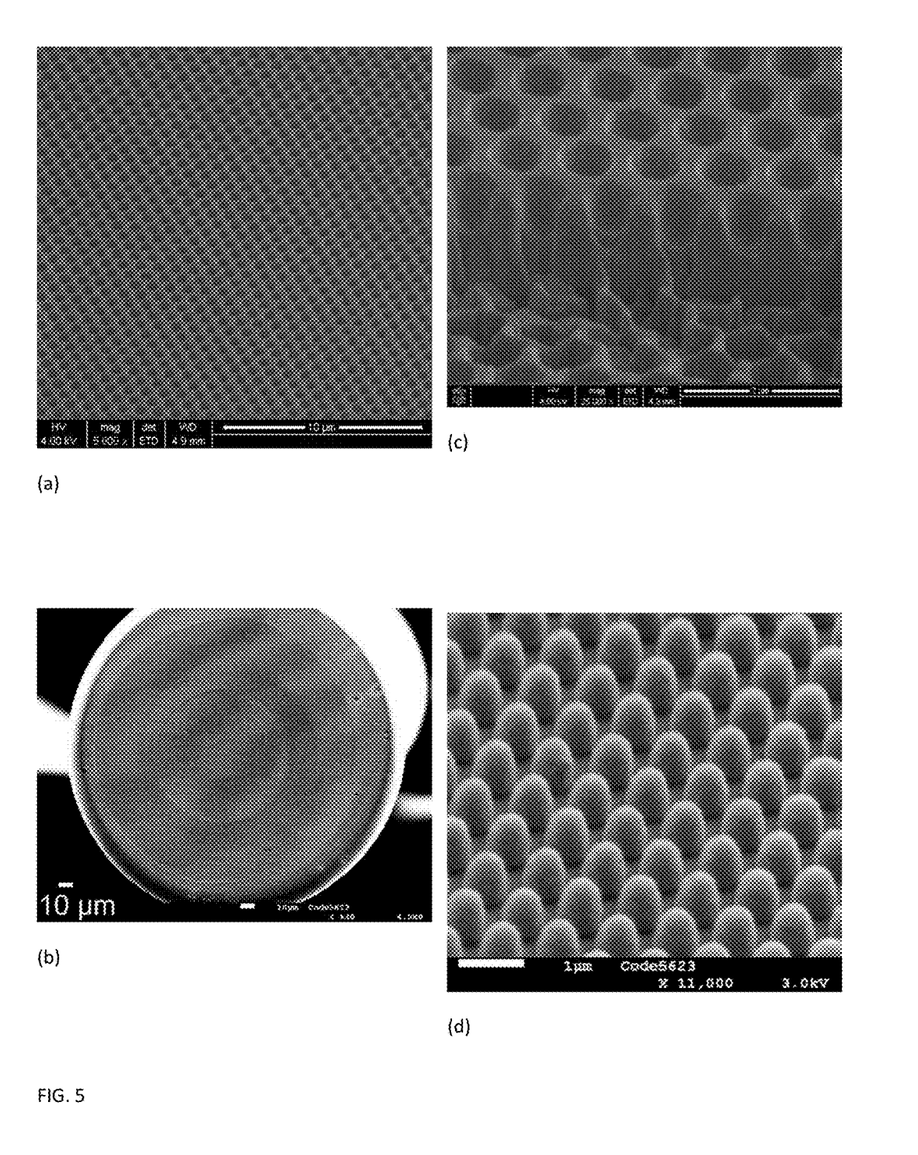
FIG. 5 illustrates (a) the shim pattern overall, (b) the shim in detail, (c) the fiber-end stamped with that pattern, and (d) the stamped fiber-end in detail.

The laser-delivery cable is connected to a high-power 795 nm laser diode powered by an appropriate laser controller, such as a Thorlabs LDC-4005 controller. The shim is heated to a temperature in the 200-230° C. range. The heating rate is a relaxed parameter allowing for a large range of values limited only by the shim's thermal conductivity and its robustness to temperature gradients. Once the target temperature has been reached, the shim is pushed against the fiber where it is held in contact for 10 to 60 seconds and then removed. The speeds with which the shim is brought into contact and removed from contact are dependent of the fiber material and of the temperature and pressure at which the stamping process occurs. In this particular case, since the shim used is made of individual pillars, no vacuum is required. The micro-pattern is directly imprinted onto the fiber end. FIG. 5 shows the images of the shim and of the patterned fiber end. The P4-G port can be used to flush the chamber with ultra-dry nitrogen gas to remove water vapor potentially present around the fiber end.

The cameras at ports P5-W and P6-W allow monitoring of the proper distance before the fiber end and the shim in order to make the appropriate adjustments as needed. Such adjustments include X-Y alignment and tip-tilt (pitch-yaw) adjustments such that the fiber end surface and the shim pattern area are aligned and parallel to each other.

The stamped fiber is removed from the P1-F port and another fiber can be immediately mounted and stamped in the same fashion. The heating laser can be left on or it can be turned off between the stamping runs. A temperature feedback control system can be put into place such that the laser diode current is properly modulated such as to provide constant temperature at the shim surface. The temperature is measured either indirectly (thermocouple mounted in the shim mount P2-S/P) or directly either through a remote bolometer or based on surface reflectivity measurements using an external, ultra-stable visible laser source. The P1-F port or the P5-W and P6-W ports can be used for these direct measurements.

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A fiber-end surface structuring system, comprising:
   a main body comprising multiple ports;
   a fiber-holder port comprising a fiber-holder port accessory that comprises means to attach an optical fiber such that the fiber extends out of the fiber-holder port from between 1 and 2000 microns;
   a process port comprising a process port accessory that comprises means to mount a patterned shim and a laser delivery fiber mount, wherein the shim can be moved, tilted, or both with respect to the fiber;
   an evacuation port;
   a gas delivery port; and
   one or more observation ports;
   wherein said fiber-end surface structuring system forms structures directly into the end of the fiber.

2. The system of claim 1, wherein the means to attach the optical fiber, the means to mount the patterned shim, or both comprise a vacuum flange.

3. The system of claim 1, wherein the fiber extends out of the fiber-holder port from between 50 to 500 microns.

4. The system of claim 1, wherein the process port is axially opposite to the fiber-holder port.

5. The system of claim 1, wherein the process port accessory additionally comprises a thermocouple, a bolometer, a surface reflectance measurement device, or any combination thereof.

6. The system of claim 1, wherein the structures on the end of the fiber have a quasi-random pattern.

7. The system of claim 1, wherein the structures on the end of the fiber have a periodic pattern.

8. A method for creating a surface structure with quasi-random micro-scale features, nano-scale features, or a combination thereof directly into a fiber end using the system of claim 1.

9. A fiber-end surface structuring system, comprising:
   a main body comprising multiple ports;
   a fiber-holder port comprising a fiber-holder port accessory that comprises a connector to attach an optical fiber such that the top surface of the connector is flush with the fiber-holder port accessory or below the fiber-holder port accessory by less than 250 microns;

a process port comprising a process port accessory that comprises a plasma gas delivery system and an electrode to generate and sustain a plasma; and an evacuation port.

10. The system of claim 9, wherein the connector comprises a vacuum flange.

11. The system of claim 9, wherein the process port is axially opposite to the fiber-holder port.

12. The system of claim 9, wherein the structures on the end of the fiber have a quasi-random pattern.

13. The system of claim 9, wherein the system operates as a capacitive-coupled parallel-plate plasma etching system.

14. A method for creating a surface structure with quasi-random micro-scale features, nano-scale features, or a combination thereof directly into a fiber end using the system of claim 9.

* * * * *